United States Patent [19]
Youn

[11] Patent Number: 5,971,780
[45] Date of Patent: Oct. 26, 1999

[54] MECHANISM FOR MOUNTING AND DISMOUNTING A PACK ASSEMBLY ON A COMPUTER SYSTEM

[75] Inventor: Jae-Sam Youn, Kyungki-do, Rep. of Korea

[73] Assignee: SamSung Electronics Co., Ltd., Kyungki-do, Rep. of Korea

[21] Appl. No.: 08/951,975

[22] Filed: Oct. 16, 1997

[30] Foreign Application Priority Data

Oct. 16, 1996 [KR] Rep. of Korea ...................... 96-46175

[51] Int. Cl.⁶ .................................................. H01R 13/62
[52] U.S. Cl. ......................... 439/160; 361/747; 361/754; 439/298
[58] Field of Search ..................................... 439/159, 160, 439/298; 361/685, 686, 747, 754, 683

[56] References Cited

U.S. PATENT DOCUMENTS

| | | | |
|---|---|---|---|
| 4,778,394 | 10/1988 | Smith | 439/59 |
| 4,947,289 | 8/1990 | Dynie | 361/801 |
| 4,954,928 | 9/1990 | Jullien . | |
| 5,305,180 | 4/1994 | Mitchell et al. . | |
| 5,331,509 | 7/1994 | Kikinis . | |
| 5,414,594 | 5/1995 | Hristake | 361/755 |
| 5,446,618 | 8/1995 | Tetsuya et al. . | |
| 5,447,444 | 9/1995 | Matsuoka | 439/266 |
| 5,488,572 | 1/1996 | Belmont . | |
| 5,572,402 | 11/1996 | Jeong . | |
| 5,717,571 | 2/1998 | Helot | 361/685 |
| 5,740,012 | 4/1998 | Choi | 361/686 |

*Primary Examiner*—Neil Abrams
*Assistant Examiner*—Michael C. Zarroli
*Attorney, Agent, or Firm*—Robert E. Bushnell, Esq.

[57] ABSTRACT

A lever plate pivotally mounted on a bottom case of a main body of a computer including an extension, rotatable against a pack assembly to discharge same from a computer housing, and a deflectable detent lug selectively engageable with the pack assembly.

14 Claims, 9 Drawing Sheets

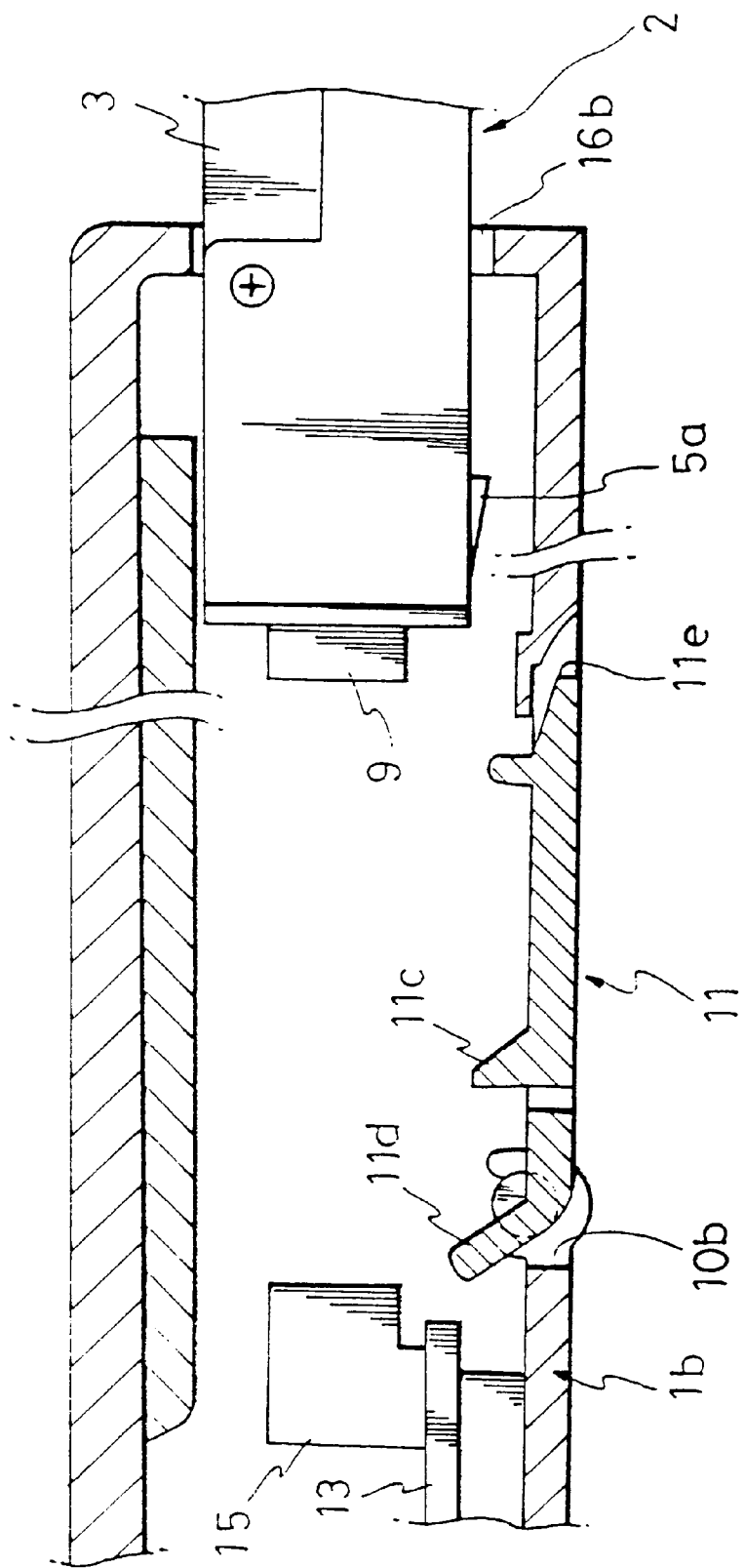

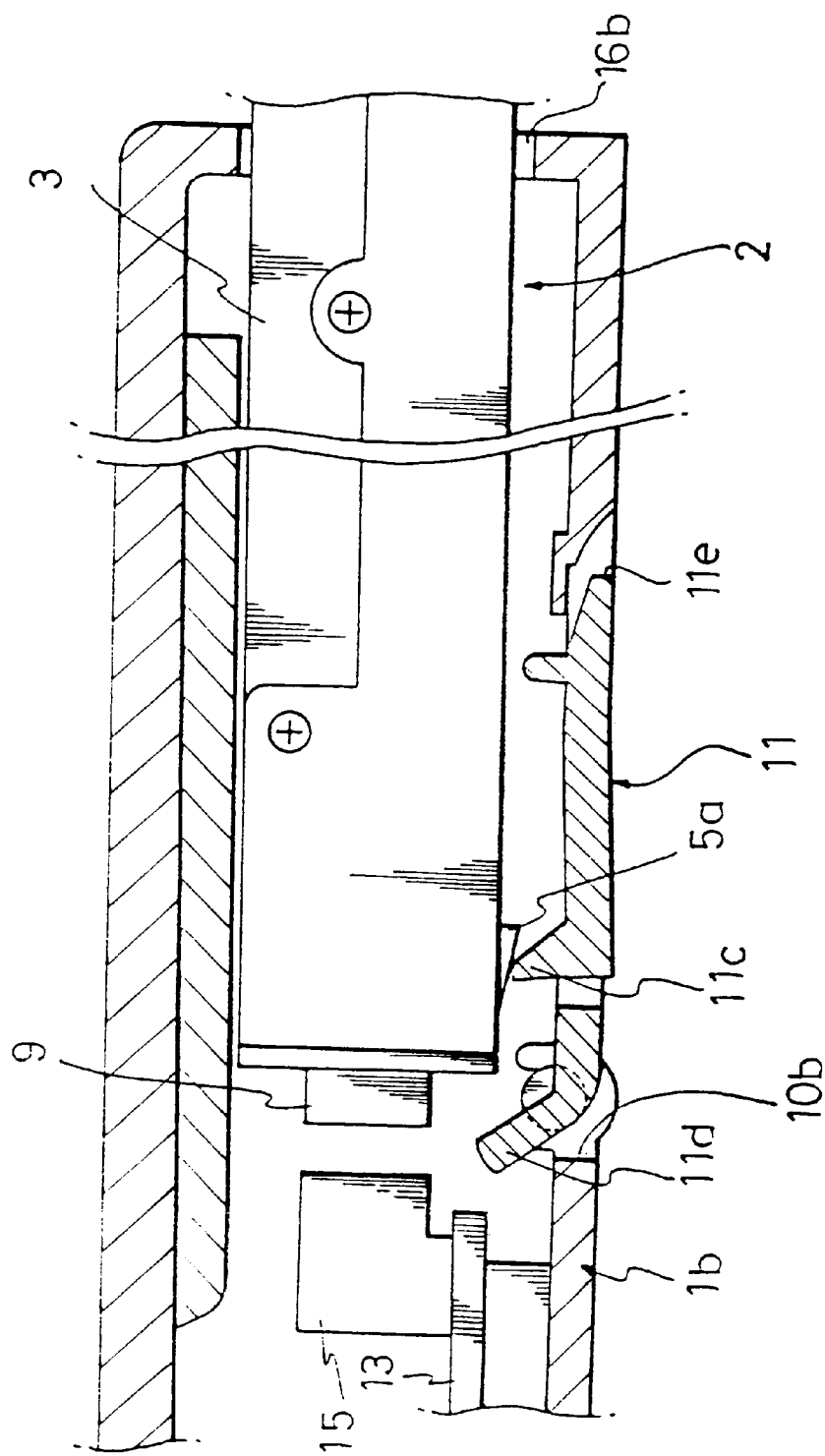

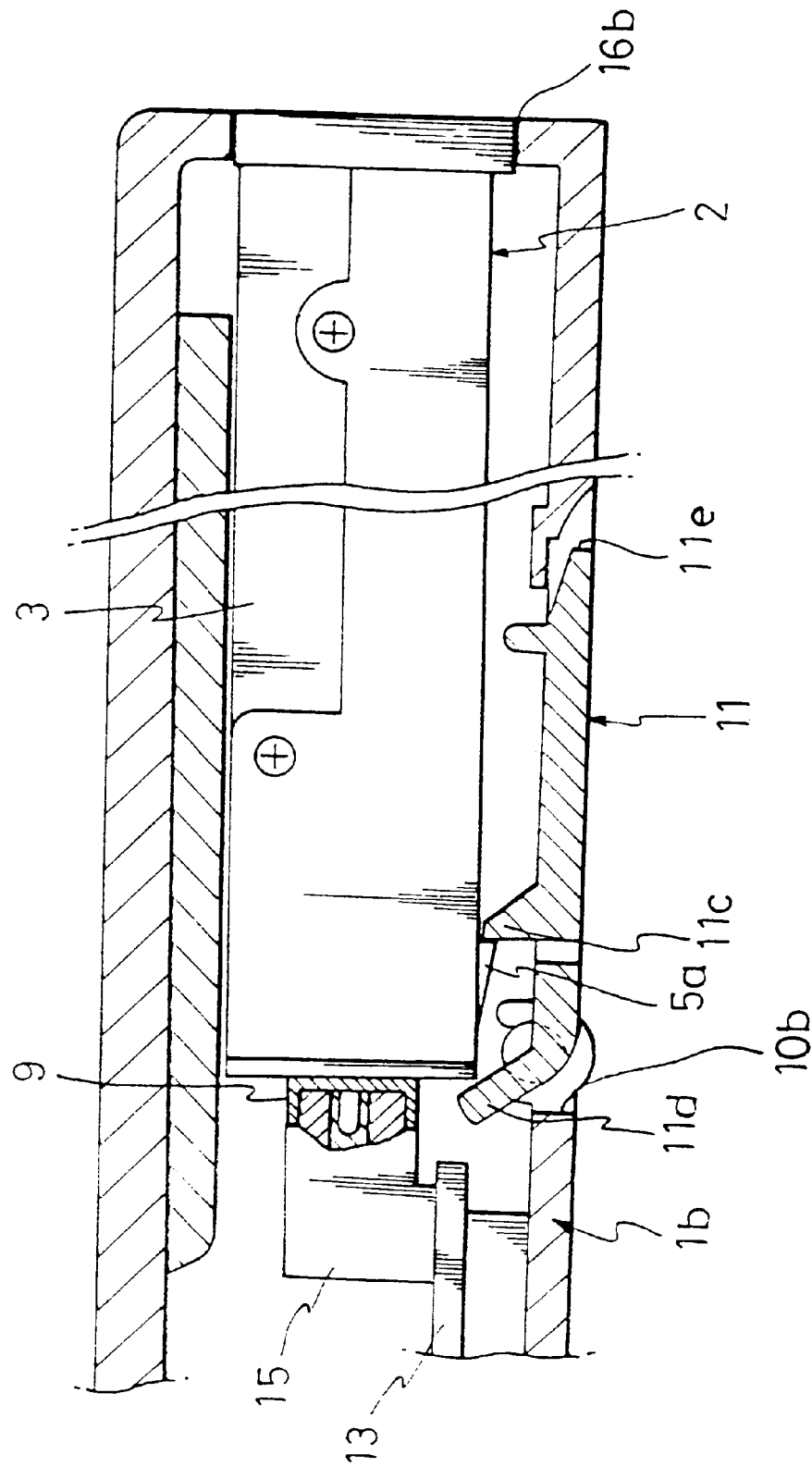

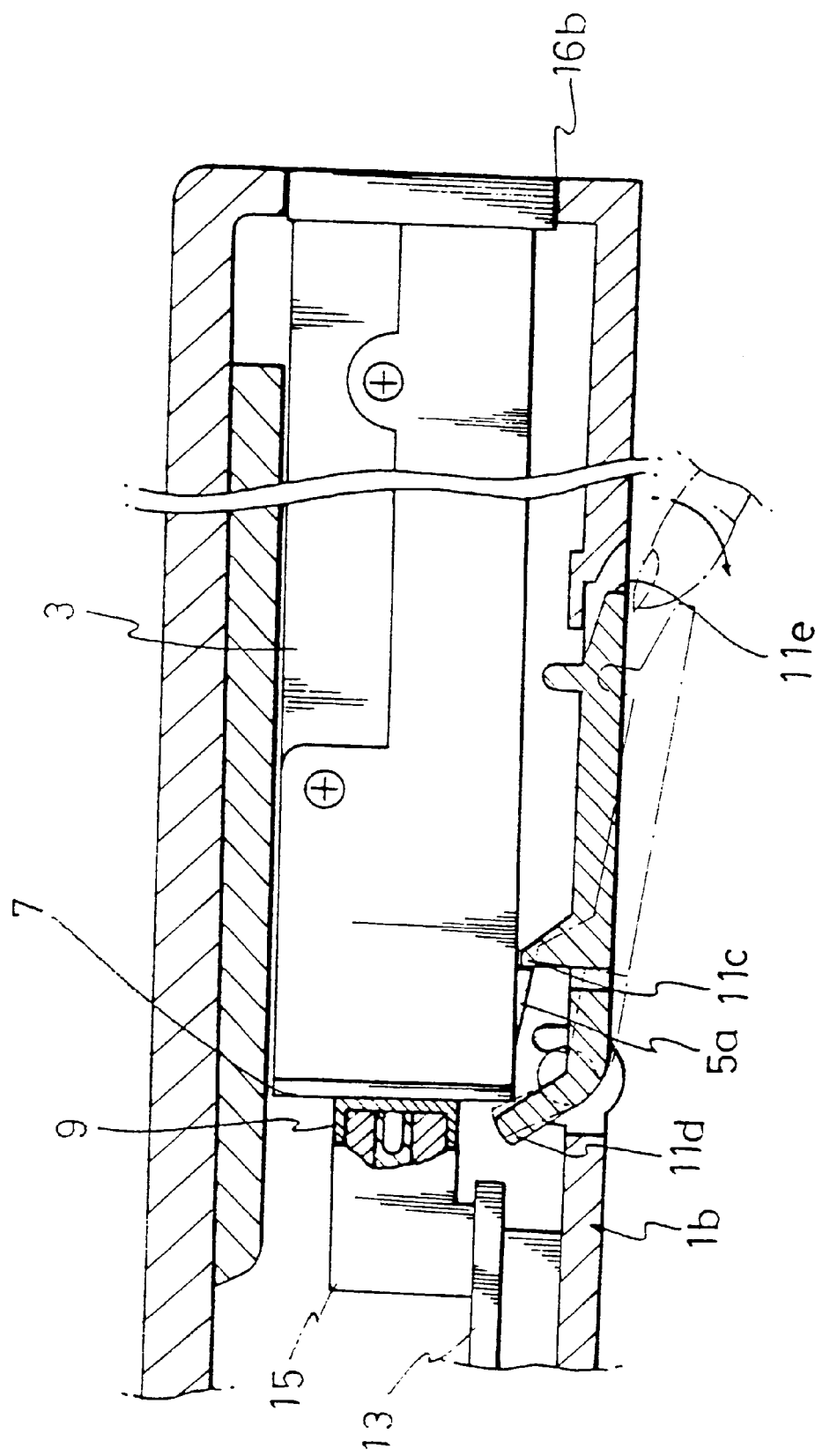

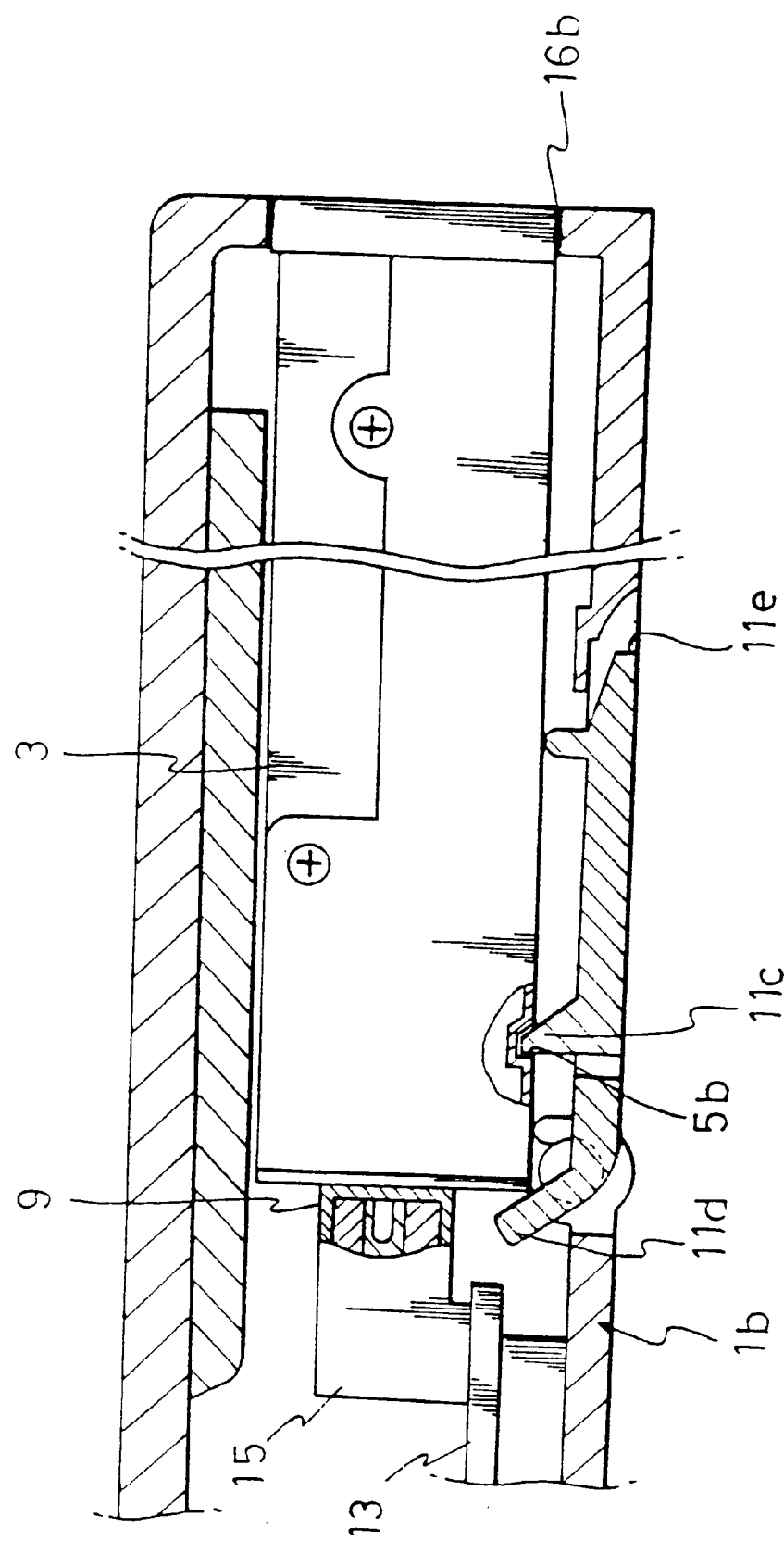

MECHANISM FOR MOUNTING AND DISMOUNTING A PACK ASSEMBLY ON A COMPUTER SYSTEM

CLAIM OF PRIORITY

This application makes reference to, incorporates the same herein, and claims all benefits accruing under 35 U.S.C. §119 from an application entitled *Mechanism for Mounting/Dismounting a Pack Assembly On a Computer System* earlier filed in the Korean Industrial Property Office on Oct. 16, 1996, and there duly assigned Ser. No. 96-46175 by that Office.

FIELD OF THE INVENTION

The present invention relates to portable computers generally, and more particularly, mechanisms for mounting pack assemblies on portable computers.

BACKGROUND OF THE INVENTION

Peripheral equipment, such as floppy disk drives and CD-ROM drives, are widely used with portable computers. In the past, such peripheral equipment was structurally incorporated into the main body of the computer as permanent integral components that were thus not readily removable. In recent years however, peripheral equipment has been designed to be incorporated into pack-type assemblies so as to permit removable connection to a portable computer. Pack assemblies typically are fixed in or released from the main body by a mounting mechanism that includes a safe-locking device preventing damage caused by inadvertent release of the assembly.

U.S. Pat. No. 5,446,618 for *Personal Computer Security Apparatus with Lockable Slides Engaging Removable Cover* issued to Tetsuya et al. includes a plate with arms that retain protuberances on a cover. The cover retains a hard drive coupling. U.S. Pat. No. 4,954,928 for *Memory Cartridge for Electronic Equipment, and Electronic Equipment Provided with Such Cartridges* issued to Jullien includes a flap having a bearing with a camming surface. To eject the memory unit from a computer, the user rotates the flap, thereby urging the camming surface against a shoe-forming element.

U.S. Pat. No. 5,572,402 for *Hard Disk Drive Mounting Assembly for a Computer* issued to Jeong includes a case with pins pivotally mounting the case in a computer housing. The device also includes spring catches that engage the edges of an opening in the computer housing to secure the case in a closed position. Additionally, the device has apertures that receive rail hooks formed on the sliding members of the hard disk drive.

U.S. Pat. No. 5,305,180 for *Disk Drive Ejector Mechanism with Latch and Ejector and Standby Switch* issued to Mitchell et al. includes hooks received in apertures of a hard drive housing. The device also includes a member with an end that may be pivoted against the case of the hard drive in order to eject the case. U.S. Pat. No. 5,331,509 for *Modular Notebook Computer Having a Planar Array of Module Bays and a Pivotally Attached Flat-panel Display* issued to Kikinis, referring to FIG. 3, includes locking tabs that lock against protrusions extending from a module. The button retracts the protrusions to release the module.

U.S. Pat. No. 5,488,572 for *Portable Computer System for Docking to an Expansion Base Unit* issued to Belmont includes hooks that engage and retain a portable computer in a docking station.

SUMMARY OF THE INVENTION

The present invention includes a lever plate pivotally mounted on a bottom case of a main body of a portable computer. The lever plate has a free end with a detent lug which is selectively engaged with a lock formed on the pack assembly to fix the pack assembly to the main body. The lever plate includes pivots, formed on both sides thereof, received in coupling grooves in an inner surface of the bottom case. The lever plate includes an extension portion at one end that contacts one end of the pack assembly. To discharge the pack assembly, the lever plate is rotated, urging the extension portion against the pack assembly.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 5a through 5c are partial front vertical cross-sectional detail views of the present mounting mechanism, receiving a pack assembly;

FIG. 6 is a partial front vertical cross-sectional detail view of the present mounting mechanism being actuated to release pack assembly; and FIG. 7 is a partial front vertical cross-sectional of the another embodiment of the present invention, receiving a pack assembly.

DETAILED DESCRIPTION OF PREFERRED EMBODIMENTS

Figure 1B:
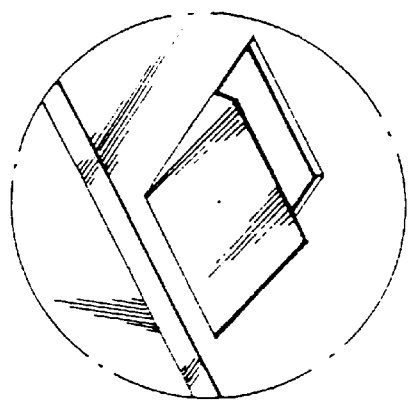
FIG. 1B is an enlarged bottom front left perspective view of the present detent projection of a pack assembly.
Figure 1A:
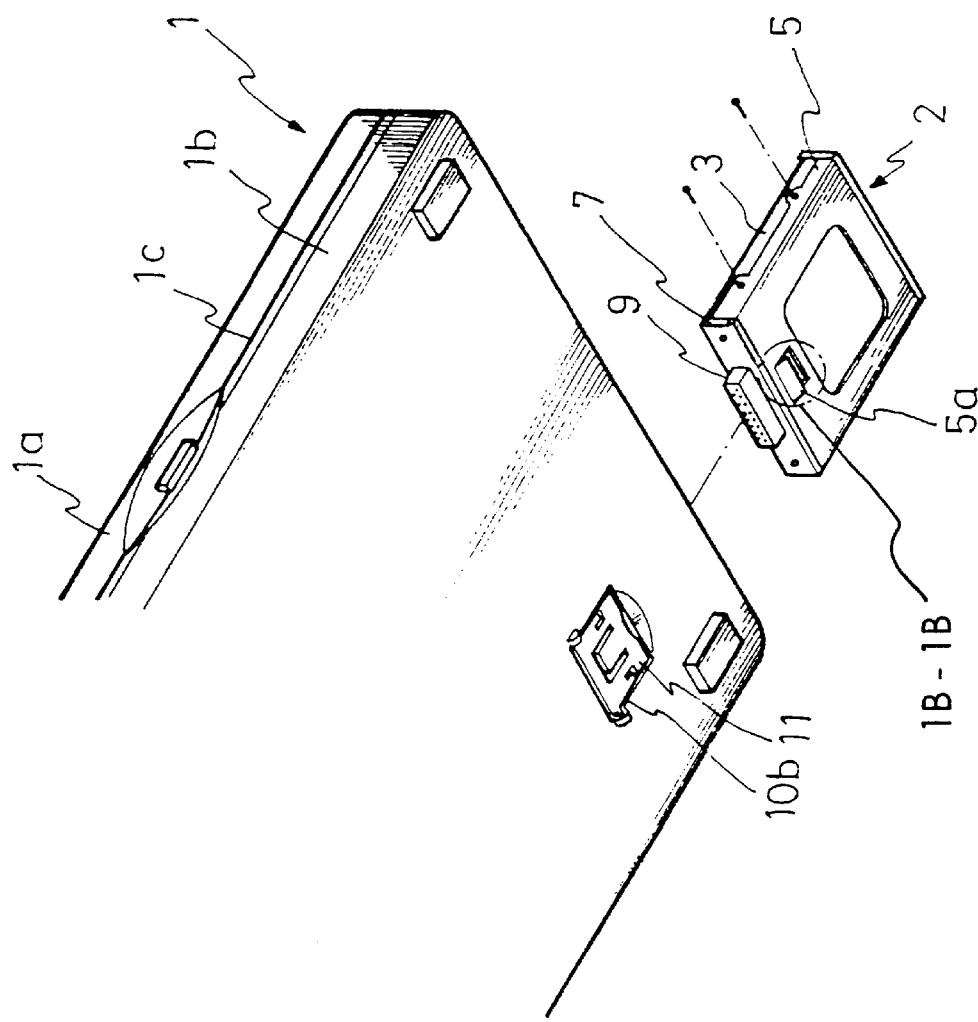
FIG. 1A is a partial bottom front left exploded perspective view of a portable computer including a mounting device constructed according to the principles of the present invention.

Referring to FIG. 1A a typical notebook computer 1 includes a top cover 1c mounted on a bottom case 1b, and a display housing 1a rotatably mounted on the top cover 1c. The bottom case 1b and the top cover 1c define a main body of the notebook computer.

A pack assembly 2 is designed to be releasably inserted into the main body. The pack assembly 2 includes a pack 3, a bracket 5 on which the pack 3 is mounted, and an interface board 7 and a connector 9, both of which are mounted on the bracket 5.

As shown in FIGS. 5a–5c, the pack assembly 2 is inserted into the bottom case 1b such that the connector 9 faces inwardly, detachably fixed to the bottom case by the mounting/dismounting mechanism.

Figure 2:
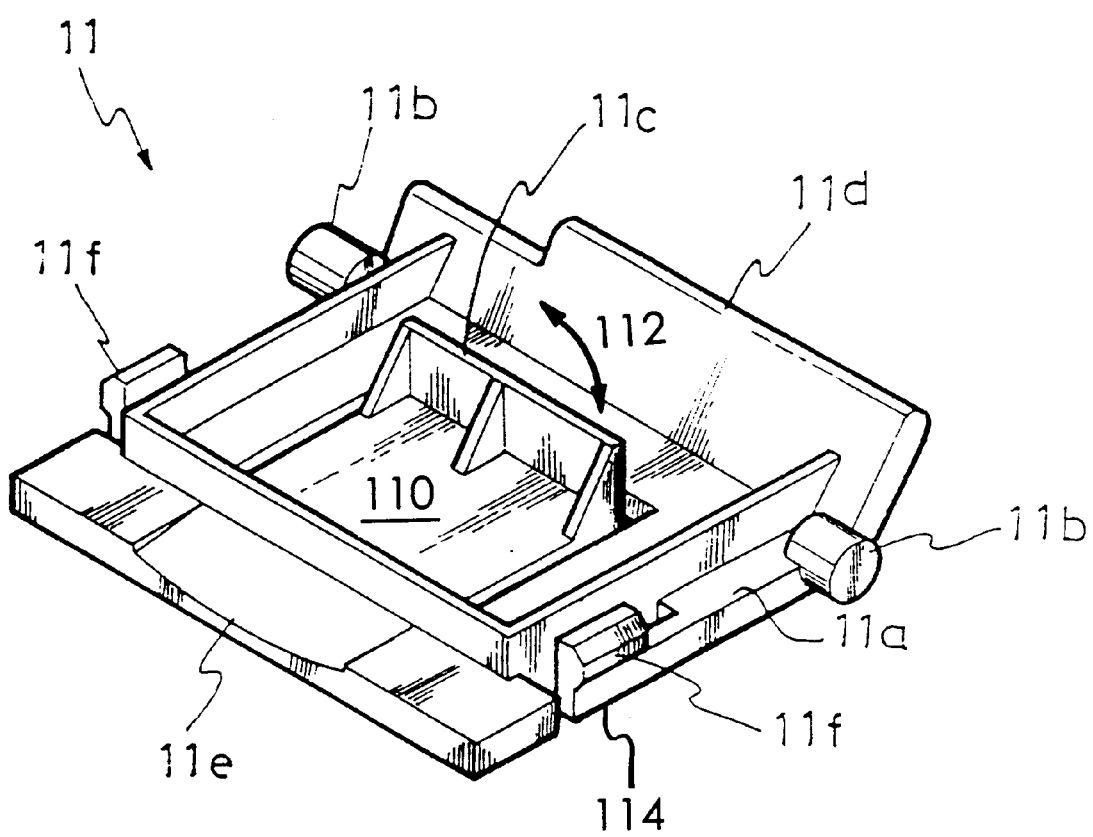
FIG. 2 is a top left front perspective view of a lever plate constructed according to the principles of the present invention.

Referring also to FIG. 2, the mounting/dismounting mechanism includes a lever plate 11, which is disposed in a coupling hole 10b formed on the bottom case 1b. One end of the lever plate 11 is pivotally mounted on the bottom case 11b. The lever plate 11 includes a base 11a with pivots 11b extending from both sides. A lug 11c extends from the end of a centrally-located tab 110. The tab 110, and therefore the lug 11c, is deflectable in a direction 112. The lug 11c is intended to mate and capture a detent projection 5a of the pack assembly 2 (see FIG. 1).

The lever plate includes a lever extension portion 11d which extends upwardly from one end of the base 11a at a predetermined angle. The lever plate has an indent 11e formed on the other end of the base 11a. The lever extension portion 11d urges the pack assembly 2 out of the bottom case 1b when the lever plate 11 is rotated. The indent 11e provides for easy manipulation of the lever plate.

The lever plate also includes hooks 11f on both sides of the base 11a, supported on free ends 114 extending from both sides of the base 11a, biasing the hooks 11f toward a predetermined position.

Figure 3:
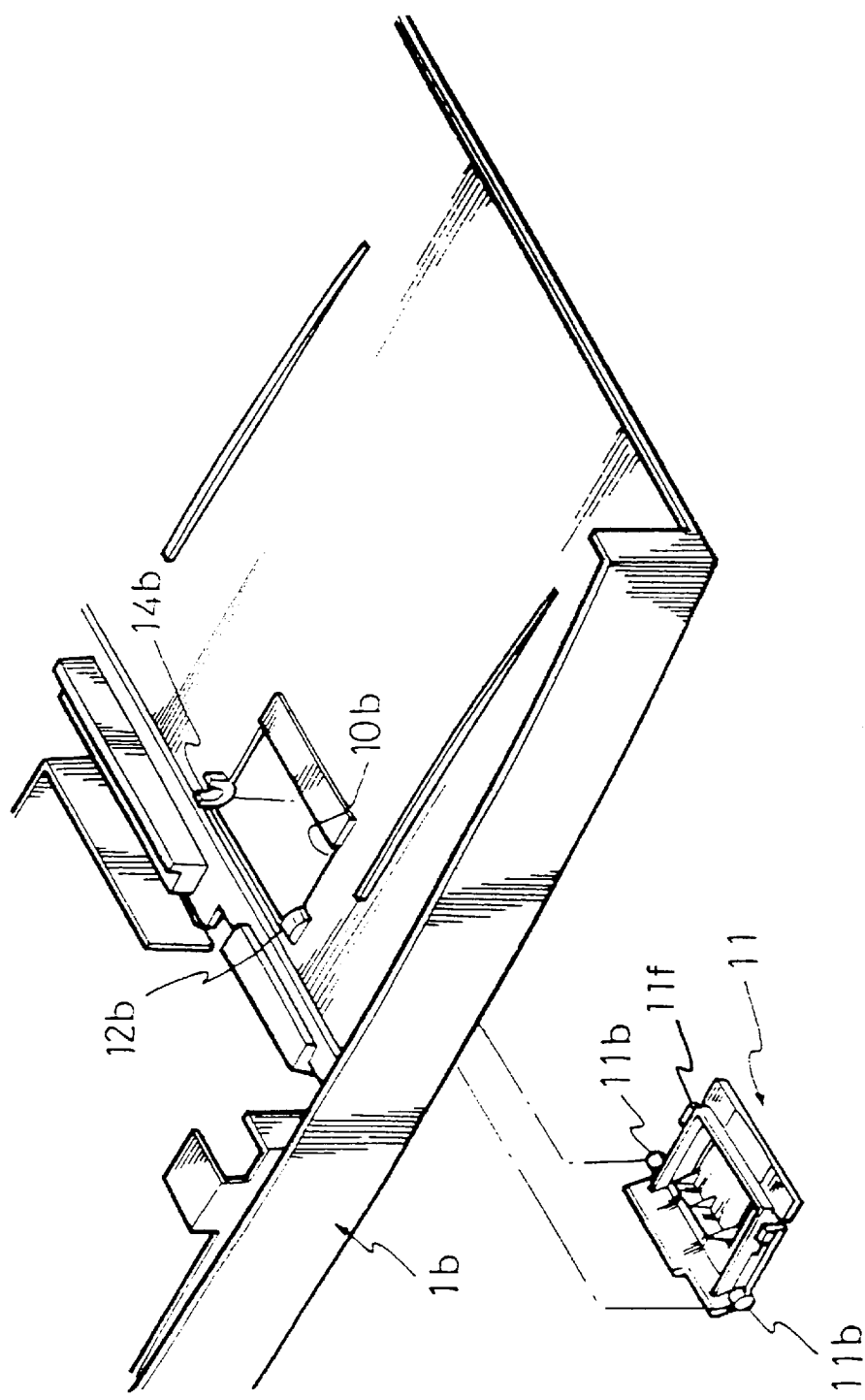
FIG. 3 is a top right front exploded perspective view of a mounting mechanism constructed according to the principles of the present invention.
Figure 4:
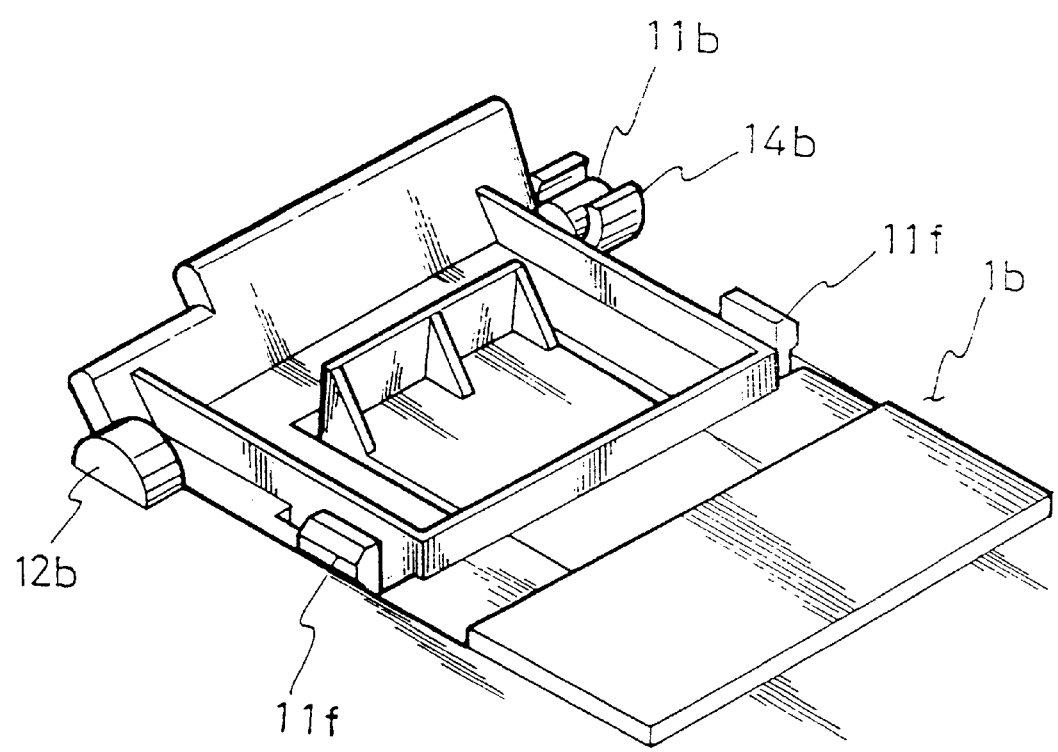
FIG. 4 is a partial top right front perspective view of the lever plate mounted on the bottom of the computer.

Referring to FIGS. 3 and 4, the lever plate 11 is inserted into the coupling hole 10b, the coupling pivots 11b being fitted into coupling grooves 12b and 14b on the inner surface of the bottom case 1b. One coupling groove 12b is a closed type coupling groove and has a boss which includes a hole for receiving one coupling pivot 11b into the hole of the boss and the other coupling groove 14b is an opening-type coupling groove formed on the circumference of the groove 14b to receive the other pivot 11b through the opening. When fitting the coupling pivots 11b into the coupling grooves 12b and 14b, one of the coupling pivots 11b first is horizontally inserted into the closed coupling groove 12b, then the other 11b is downwardly snapped into the open-type coupling groove 14b. The lever plate 11 remains pivotally mounted about an axis of the coupling pivots 11b. The hooks 11f are rotated to fit over the periphery of the of the hole 10b of the inner surface of the bottom case 1b.

Referring to FIGS. 5a–5c, to mount the pack assembly 2 on the bottom case 1b, the pack assembly first is inserted into the bottom case 1b through an insert hole 16b formed on a side of the bottom case 1b. When the pack assembly 2 is inserted, the detent projection 5a contacts the detent lug 11c, as shown in FIG. 5b. When the user urges the pack assembly 2, farther inward, the detent projection 5a passes over the detent lug 11c as shown in FIG. 5c. When the connector 9 is connected to a connector 15 of a main board 13 inside the bottom case 1b, the mounting process of the pack assembly 2 is completed. The detent projection 5a and lug 11c, as well as connecting force between the connectors 9 and 15, secures the pack assembly to the bottom case. In addition, the hooks 11f enhance the mounting force of the pack assembly 2. That is, the coupling hooks 11f function as a dual locking mechanism to assure that the pack assembly 2 does not inadvertently become disengaged.

Referring to FIG. 6, the dismounting process of the pack assembly 2 is performed by the user placing a finger in the indent and rotating the lever plate 11 downwardly. The lever plate 11 rotates such that the lever extension portion 11d contacts the front end of the pack assembly 2 (i.e., the interface board 7) and urges its discharge. Continued rotation causes the flexible hooks 11f move and snap out of the coupling hole 10b.

Referring to FIG. 7, another embodiment provides the locking part includes a detent groove 5b, rather than the detent projection 5a.

The present invention is not limited to the disclosed embodiments, but encompasses all embodiments within the scope of the appended claims.

What is claimed is:

1. An apparatus for releasably mounting a pack assembly on a computer housing comprising a lever plate, said lever plate comprising:

a pivot extending from each side of said lever plate, rotatably coupled to coupling grooves of the computer housing;

a detent lug extending from one end of a central tab located on center portion of said lever plate, selectively engaged with a detent formed on a bottom side of said pack assembly; and an extension portion extending from one side of one end of said lever plate, contacting a front and long side of said pack assembly when the pack assembly is dismounted from said computer housing by said extension portion on the basis of rotation of said lever plate; and a pair of hooks, disposed on both sides of said lever plate, maintaining said lever plate in a coupling hole of said computer housing while said pivot is coupled to said coupling groove.

2. The apparatus of claim 1, wherein said detent lug of said central tub is deflectable.

3. An apparatus for releasably mounting a pack assembly on a computer housing, comprising:

a coupling hole formed on a bottom side of said computer housing;

a first connector formed on said computer housing;

a second connector formed on a front side of said pack assembly;

a lever plate, pivotally mounted on said coupling hole of said computer housing, including a detent lug selectively engaging with a detent formed on one side of said pack assembly and an extension portion extending from one side of one end of said lever plate;

one side of one end of said extension portion contacting said front and a long side of said pack assembly when said second connector of said pack assembly is disconnected from said first connector of said computer housing on the basis of rotation of said lever plate.

4. The apparatus as recited in claim 3, further comprised of said lever plate, having pivots on both sides, rotatably coupled to coupling grooves of said computer housing.

5. The apparatus of claim 3, further comprised of flexible hooks disposed on both sides of said lever plate, said hooks being received in said coupling hole of the computer housing.

6. The apparatus of claim 3, further comprised of said detent lug securing one of a detent projection extending from and a detent groove in said pack assembly.

7. A device for mounting and dismounting a peripheral device on a computer housing, comprising:

a first connector formed on a front wall of said peripheral device;

a second connector formed on said computer housing;

a coupling hole formed on said computer housing;

a lever plate, rotatably mountable on the computer housing;

an extension portion extending from one side of one end of said lever plate;

one side of end of said extension portion contacting a long side of said front wall of said peripheral device and urging disconnection of said first connector of said peripheral device from said second connector of said computer housing when said lever plate is rotated toward a discharge position.

8. The device of claim 7, further comprised of a detent lug extending from a center portion of said lever plate, retaining the peripheral device when said lever plate assumes a locked position.

9. The device of claim 8, wherein said detent lug is deflectable.

10. The device of claim 8, further comprised of said detent lug engaging an extension of the peripheral device.

11. The device of claim 8, further comprised of said detent lug engaging a groove in the peripheral device.

12. The device of claim 7, further comprised of a hook extending from a free end of said lever plate, selectably retaining said coupling hole of said computer housing in a locked position.

13. The device of claim 12, further comprised of said hook being biased toward a retaining position.

14. The device of claim 7, further comprised of said lever plate including a pair of pivot pins, one of said pivot pins being received in a bore in the housing, the other of said pivot pins being received in an open slot in the housing.

* * * * *